(12) United States Patent
Leconte et al.

(10) Patent No.: US 7,050,335 B2
(45) Date of Patent: May 23, 2006

(54) FLASH MEMORY COMPRISING MEANS FOR CHECKING AND REFRESHING MEMORY CELLS IN THE ERASED STATE

(75) Inventors: Bruno Leconte, Rousset (FR); Paola Cavaleri, Rousset (FR); Sébastien Zink, Aix en Provence (FR)

(73) Assignee: STMicroelectronics S.A., Montrouge (FR)

(*) Notice: Subject to any disclaimer, the term of this patent is extended or adjusted under 35 U.S.C. 154(b) by 0 days.

(21) Appl. No.: 10/867,378

(22) Filed: Jun. 14, 2004

(65) Prior Publication Data

US 2005/0018490 A1  Jan. 27, 2005

(30) Foreign Application Priority Data

Jun. 12, 2003 (FR) .................................. 03 07052

(51) Int. Cl.
*G11C 16/04* (2006.01)
(52) U.S. Cl. .................. 365/185.29; 365/222
(58) Field of Classification Search ................ 365/29
See application file for complete search history.

(56) References Cited

U.S. PATENT DOCUMENTS

| | | | |
|---|---|---|---|
| 5,274,599 A | 12/1993 | Ema | 365/218 |
| 5,400,287 A | 3/1995 | Fuchigami | 365/218 |
| 5,633,823 A | 5/1997 | Lee | 365/185.29 |
| 6,084,471 A | 7/2000 | Ruth, Jr. et al. | 330/254 |
| 6,124,761 A | 9/2000 | Robinson et al. | 330/254 |
| 6,166,959 A * | 12/2000 | Gupta et al. | 365/185.25 |
| 6,240,032 B1 | 5/2001 | Fukumoto | 365/222 |
| 6,515,910 B1 | 2/2003 | Lee et al. | 365/185.22 |
| 6,636,440 B1 * | 10/2003 | Maayan et al. | 365/185.25 |

FOREIGN PATENT DOCUMENTS

| | | |
|---|---|---|
| EP | 1 233 421 A1 | 8/2002 |
| EP | 1 271 552 A2 | 1/2003 |

OTHER PUBLICATIONS

Derwent Database WPI Accession No. 2001-057886 for KR 2000 010 421 A, published Feb. 15, 2000.

* cited by examiner

*Primary Examiner*—Thong Q. Le
(74) *Attorney, Agent, or Firm*—Lisa K. Jorgenson; Dennis M. de Guzman; Seed IP Law Group PLLC

(57) ABSTRACT

The present invention relates to a method for checking and refreshing a floating-gate transistor in the erased state, comprising the steps of applying a positive erase voltage to a control gate of the floating-gate transistor, and selectively applying a positive erase voltage to the drain of the floating-gate transistor, by means of a programming latch for example. Application to checking and refreshing memory pages in a Flash memory.

28 Claims, 5 Drawing Sheets

FLASH MEMORY COMPRISING MEANS FOR CHECKING AND REFRESHING MEMORY CELLS IN THE ERASED STATE

BACKGROUND OF THE INVENTION

1. Field of the Invention

The present invention relates to Flash memories, and more particularly a page-erasable Flash memory of the type described by the international application WO 02/41322, comprising means for checking and refreshing memory cells in the programmed state.

2. Description of the Related Art

Flash memory memory cells differ from EEPROM memory memory cells by the fact that they do not comprise access transistors. As a result, in a Flash memory array, the floating-gate transistors of the memory cells are directly linked to the bit lines of the memory array.

Another particular feature of Flash memories is that the memory cells do not have any gate control transistor. As a result, when an erase voltage is applied to a word line, the control gates of all the floating-gate transistors receive this voltage. Therefore, the erasing operation in a Flash memory is a collective operation that affects at least all the memory cells of a same word line (page). For an operation of erasing by the channel, the erasing affects all the memory cells of a same sector (memory cells having a common substrate, formed in a P-type well) unless a selective page-erase method described in the aforementioned international application is implemented.

As their memory cells do not therefore have any access transistor or gate control transistor, Flash memories provide a high density of integration in terms of number of memory cells per unit of silicon surface.

However, this simplification of the structure of the memory cells leads to various disadvantages, particularly a programming stress phenomenon.

The programming of a memory cell is indeed an operation that comprises the application, to a bit line to which the memory cell is linked, of a programming voltage Vpp (drain voltage of the floating-gate transistor). Now, all the floating-gate transistors linked to the bit line in question receive the voltage Vpp since they do not have any access transistor. This leads to an electrical stress called programming stress or drain stress.

This drain stress is particularly problematic in a page-erasable Flash memory of the type described by the aforementioned international application. Indeed, providing a page-erasable Flash memory is only worthwhile if the user is given the possibility of erasing and reprogramming a same page a considerable number of times, without being concerned about the other pages of the memory. Now, when the user applies successive erasing and programming cycles to the memory cells of a same page, the memory cells of the other pages receive the programming voltage repeatedly at their drains, which leads to a gradual alteration of the electric charges trapped in their floating gates and can result in data corruption.

To overcome this disadvantage, the aforementioned international application suggests a program refresh method comprising a step of cyclically checking the pages of the memory, and a step of refreshing the programmed memory cells that have lost electric charges. This refresh involves reprogramming the memory cells and avoids these memory cells gradually switching into the erased state.

BRIEF SUMMARY OF THE INVENTION

The present invention is based on the observation according to which the electrical stress phenomenon not only deprograms memory cells in the programmed state by causing them to lose electric charges but also affects the memory cells in the erased state. Indeed, it can be seen that electric charges are slowly trapped in the floating gates of the erased memory cells, which gradually tend towards the programmed state. This phenomenon is slower than the "deprogramming" phenomenon of programmed memory cells, but can lead to data corruption after thousands of electrical stress cycles.

The present invention aims to overcome this disadvantage.

However, although it is technically possible to individually reprogram programmed memory cells that have lost electric charges, it seems, at first sight, impossible to refresh (re-erase) erased memory cells having received a spurious injection of electric charges. Programming is indeed a selective operation, which comprises the application of a programming voltage to the bit lines of the memory cells to be programmed, thanks to individually selectable programming latches, while the erasing is a collective operation, as stated above, which affects at least all the memory cells of a same word line or all the memory cells of a same sector.

As a result, a selective erase refresh is not possible with a classical method for erasing Flash memory cells. If one page comprises programmed transistors that must be program refreshed and erased transistors that must be erase refreshed, the programmed transistors can be individually refreshed but the erased transistors cannot be individually refreshed at the risk of erasing the programmed transistors of the page. That is why the aforementioned international application only suggests a program refresh.

Therefore, one object of the present invention is to provide, in a memory in which all the memory cells of a page are collectively erased, a selective erase method allowing memory cells in the erased state to be individually refreshed without erasing memory cells that are in the programmed state.

This object is achieved by providing a method for checking and refreshing a floating-gate transistor in the erased state, comprising the steps of applying a positive erase voltage to a control gate of the floating-gate transistor, and applying a positive erase voltage to the drain of the floating-gate transistor.

According to one embodiment, the positive erase voltage is supplied by a programming latch of the floating-gate transistor.

According to one embodiment, the positive erase voltage is equal to a programming voltage supplied by the latch when the floating-gate transistor is programmed.

According to one embodiment, the method comprises a step of checking the threshold voltage of the floating-gate transistor, the checking step comprising reading the transistor with a first read voltage and reading the transistor with a second read voltage.

The present invention also relates to a method for checking and refreshing a page of Flash memory comprising a plurality of floating-gate transistors linked by their control gates to a common word line, and linked by their drains to different bit lines, the Flash memory comprising programming latches linked to the bit lines to selectively apply a programming voltage to the drains of the floating-gate transistors, comprising a step of refreshing floating-gate transistors of the page that are in the erased state, the refreshing step comprising the steps of applying a positive erase voltage to the word line, and applying a positive erase voltage to the bit lines linked to the drains of floating-gate transistors that must be refreshed.

According to one embodiment, the positive erase voltage is supplied by programming latches.

According to one embodiment, the positive erase voltage is equal to the programming voltage.

According to one embodiment, the method comprises a step of checking the threshold voltage of the floating-gate transistors of the page and the checking step comprises a step of reading the transistors with a first read voltage applied to the word line, and a step of reading the transistors with a second read voltage applied to the word line, a transistor only being refreshed if two bits read in the transistor with the two read voltages, have different values.

According to one embodiment, the checking and the refreshing of a page comprises the following steps: i) reading all the transistors of the page with a first read voltage, by group of M transistors, and loading into a buffer memory groups of M bits read with the first read voltage, ii) reading a group of M transistors of the page with a second read voltage, iii) logically combining bit by bit the M bits read with the second read voltage and the M bits read with the first read voltage loaded into the buffer memory, iv) loading M bits forming the result of the logic combination into the buffer memory, v) repeating the steps ii), iii) and iv) for each subsequent group of M transistors, until the page has been entirely checked, vi) successively loading into programming latches the groups of M bits present in the buffer memory, each loading operation being accompanied by an application of the positive erase voltage to the word line and by the activation of the programming latches.

According to one embodiment, the bit-by-bit logic combination is performed by means of EXCLUSIVE OR logic gates.

According to one embodiment, the address of the page to be checked is supplied by a non-volatile counter comprising memory cells linked to a special word line of the Flash memory.

According to one embodiment, the address of the page to be checked varies according to the column address of the first group of M non-programmed memory cells found in the counter.

According to one embodiment, the method also comprises a step of checking and refreshing floating-gate transistors in the programmed state.

The present invention also relates to a Flash memory comprising a memory array comprising a plurality of floating-gate transistors linked by their control gates to word lines, and by their drains to bit lines, the transistors linked to a same word line forming one page of the memory array, programming latches linked to the bit lines to selectively apply a programming voltage to the drains of the floating-gate transistors, a counter for designating the address of at least one page to be checked, means for checking the threshold voltage of floating-gate transistors in the programmed state of a page designated by the counter, and for reprogramming programmed transistors having a threshold voltage below a first determined threshold, and means for checking the threshold voltage of floating-gate transistors in the erased state of the page designated by the counter, and for refreshing erased transistors having a threshold voltage above a second determined threshold.

According to one embodiment, the means for refreshing erased transistors are arranged for applying a positive erase voltage to the word line to which the erased transistors are linked, and applying a positive erase voltage to the bit lines linked to the drains of floating-gate transistors that must be refreshed.

According to one embodiment, the positive erase voltage is supplied by programming latches.

According to one embodiment, the positive erase voltage is equal to the programming voltage.

According to one embodiment, the means for checking the threshold voltage of floating-gate transistors in the erased state comprise means for reading the transistors with a first read voltage, means for reading the transistors with a second read voltage, and means for comparing the data read in the transistors with the two read voltages.

According to one embodiment, the means for checking the threshold voltage of floating-gate transistors in the erased state comprise a buffer memory and a logic combiner and are arranged for: i) reading all the transistors of the page with a first read voltage by group of M transistors, and loading into the buffer memory groups of M bits read with the first read voltage, ii) reading a group of M transistors of the page with a second read voltage, iii) combining bit by bit the M bits read with the second read voltage and the M corresponding bits read with the first read voltage and loaded into the buffer memory, iv) loading into the buffer memory the M bits forming the result of the logic combination, v) repeating the steps ii), iii) and iv) for each subsequent group of M transistors, until the page has been fully checked, vi) successively loading into programming latches groups of M bits present in the buffer memory, each loading operation being accompanied by an application of the positive erase voltage to the word line and by an activation of the programming latches.

According to one embodiment, the logic combiner comprises EXCLUSIVE OR logic gates.

According to one embodiment, the counter is a non-volatile counter comprising memory cells linked to a special word line of the Flash memory.

BRIEF DESCRIPTION OF THE SEVERAL VIEWS OF THE DRAWINGS

These and other objects, features and advantages of the present invention will be explained in greater detail in the following description of the erase refresh method according to the present invention and of an example of implementation of said method in a page-erasable Flash memory, given in relation with, but not limited to the following figures.

DETAILED DESCRIPTION OF THE INVENTION

Below, a method for refreshing memory cells in the erased state ("erase refresh") will be described. This method is intended to be preferably implemented in a Flash memory in which the memory cells of a same page are collectively erased and individually programmed, and are program refreshed.

As a reminder and for a good understanding of the context of the present invention, a description will initially be given of a classical method for collectively erasing the memory cells of a page, a classical method for selectively programming memory cells, and a classical method for refreshing memory cells in the programmed state ("program refresh").

Collective Erasing of Memory Cells

Figure 1:
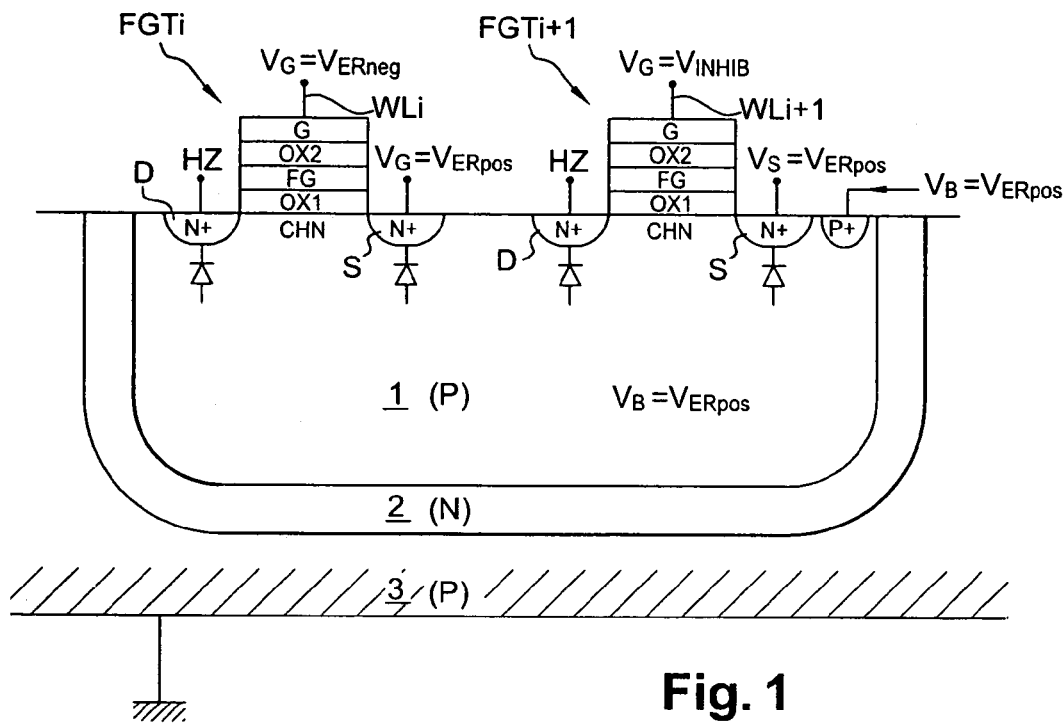
FIG. 1 is a schematic cross-section of two floating-gate transistors of Flash memory, FIG. 2 schematically shows the implementation of a page-erase method in a Flash memory, FIG. 3 schematically shows the implementation of a method for selectively programming floating-gate transistors in a Flash memory.

FIG. 1 is a cross section of two NMOS-type floating-gate transistors FGTi, FGTi+1 forming two Flash memory cells. The transistors FGT are produced in a P-type well 1 implanted in an N-type well 2 itself implanted in a P-type substrate 3. Each transistor comprises a floating gate FG deposited above the well 1 separate by a layer of tunnel oxide OX1, and a control gate G deposited above the floating gate FG separated by another layer of oxide OX2. The channel region CHN of each transistor extends beneath the gate oxide OX1 and is delimited by source and drain regions of N+ type implanted in the well 1. The control gate of the transistor FGTi is linked to a word line WLi and the control gate of the transistor FGTi+1 is linked to a word line WLi+1.

Erasing a floating-gate transistor involves extracting electric charges trapped in the floating gate, by tunnel effect (Fowler Nordheim effect). To erase one of the transistors, such as the transistor FGTi for example, the well 1 (i.e. the channel of the transistor) is taken to a voltage VB equal to a positive erase voltage VERpos, such as 9 V for example. The sources are taken to a voltage VS that is also equal to VERpos. The drain regions are taken to high impedance by a column decoder (not represented) such that a voltage VD equal to [VERpos−0.6V] appears at these regions, due to the existence of channel/drain junctions schematically represented in the shape of diodes in the forward direction. A negative erase voltage VG=VERneg, such as −9 V for example, is applied to the control gate of the transistor FGTi, while the control gate of the transistor FGTi+1 receives an inhibit voltage VINHIB. The voltage VINHIB is between 0V and 9 V but is preferably 0 V to simplify the architecture of a word line decoder supplying the voltages VINHIB and VERneg. The voltage VINHIB compensates for all or part of the electric field created by the voltage VERpos and stands in the way of the erasing of the transistor FGTi+1.

Figure 2:
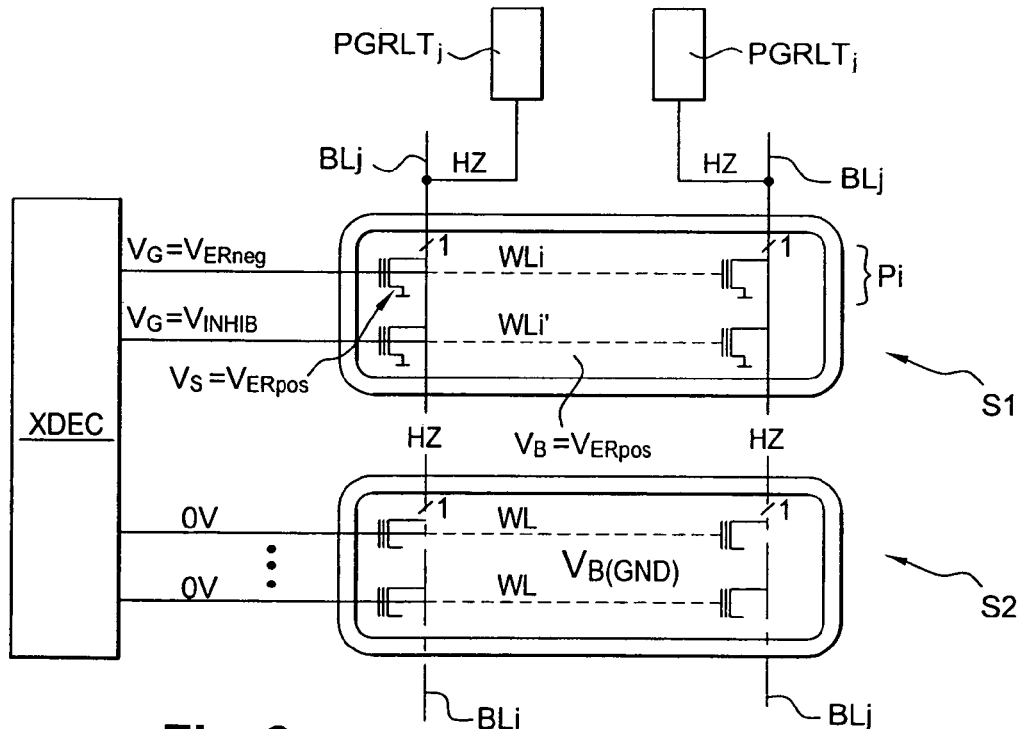

FIG. 2 shows the implementation of this erase method in a Flash memory array comprising two sectors S1, S2 each sector being formed by a P well implanted in an N well. The drains of the floating-gate transistors of each sector are linked to bit lines BLj, BLj' that are themselves linked to programming latches PGRLTj, PGRLTj'. The control gates of the floating-gate transistors are linked to word lines WLi, WLi' controlled by a word line decoder XDEC. The electrical isolation of the bit lines of the same rank of each sector, for example the line BLj of the sector S1 and the line BLj of the sector S2 is provided by a local decoding at the sectors (not represented).

It will be assumed that the page Pi of the sector S1 (word line WLi) must be erased without erasing the other pages of the sector S1 nor those of the sector S2 The well of the sector S1 and the sources of the transistors of the sector are taken to voltages VS, VB equal to VERpos. Simultaneously, the decoder XDEC supplies the negative erase voltage VERneg to the word line to be erased WLi and supplies the inhibit voltage VINHIB to the other word lines WLi' of the sector S1. Thus, only the transistors of the page Pi are erased. In the sector S2 all the bit lines BLj, BLj' are taken to high impedance, all the word lines WL receive a zero voltage (GND) and the well of the sector S2 is linked to the ground (GND). The transistors of the sector S2 are therefore insulated from the erase voltages appearing in the sector S1.

If it is desirable to collectively erase all the transistors of the same sector (transistors produced in the same well), the negative erase voltage VERneg is simultaneously applied to all the word lines of the same sector.

When all is said and done, erasing a floating-gate transistor is a collective operation that only affects the transistors of a same word line, in the event of a selective page erase, or affects all the transistors of the well in question in the event of a sector erase (application of the voltage VERneg instead of the voltage VINHIB to all the word lines of the sector).

It is therefore not possible to individually erase a floating-gate transistor using the classical erase process that has just been described. On the contrary, it is possible to individually program this transistor, as stated below, thanks to the programming latches.

Selective Programming of Memory Cells

In a Flash memory, the programming process is performed by injecting hot electrons and is selectively applicable to one or more transistors.

Figure 3:
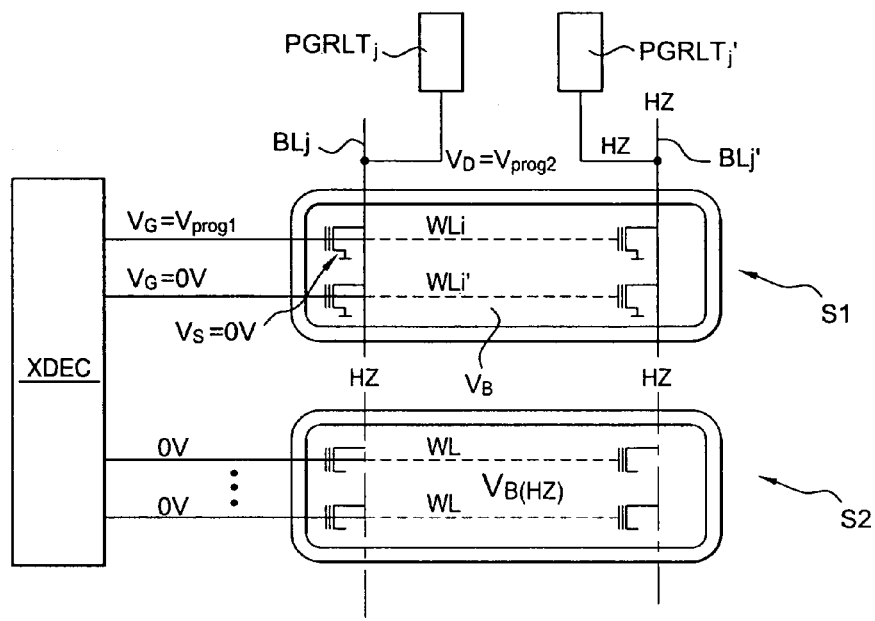

FIG. 3 represents the same Flash memory array as the one represented in FIG. 2. It will be assumed that a determined transistor must be programmed, for example the transistor linked to the bit line BLj and the word line WLi of the sector S1.

The decoder XDEC applies to the control gate of the transistor, through the word line WLi, a gate voltage VG equal to a positive programming voltage Vprog1, such as 7.5 V for example. The programming latch PGRLTj applies to the drain of the transistor to be programmed, through the bit line BLj, a drain voltage VD equal to a programming voltage Vprog2 such as 4.5 V for example. The source of the transistor is taken to a zero source voltage VS and the well corresponding to the sector in question is taken to the ground (VB=GND) or to a substantially negative voltage to improve the injection of hot electrons, such as −1.2 V for example. The transistor receiving the voltages Vprog1 and Vprog2 is on and highly biased, which results in the injection of electric charges into the floating gates (programmed state).

The transistors of the same word line that are not to be programmed, receive the voltage Vprog1 at their control gates but do not receive the voltage Vprog2 at their drains, since the corresponding bit lines BLj' are taken to high impedance HZ by the other latches. The programming is therefore a selective operation, since the programming voltages are applied to the bit lines by programming latches that are individually selectable.

The word line WLi' that does not correspond to the page in which the transistors to be programmed are located, receives a zero gate voltage VG. Similarly, in the sector S2 all the bit lines are taken to high impedance (HZ) and all the word lines are grounded.

In the sector S1, the memory cells of the word line WLi' that are linked to the bit line BLj do however, receive the programming voltage Vprog2 and undergo a programming stress. These effects are corrected by the program refresh method described below.

Checking and Refreshing Programmed Memory Cells

Figure 4:
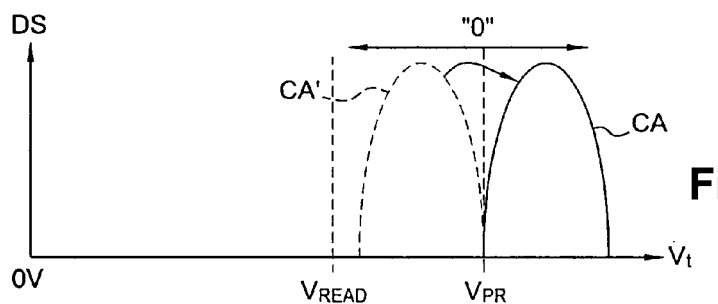
FIG. 4 shows the effect of the programming electrical stress in statistical distribution curves of threshold voltages of floating-gate transistors in the programmed state.

FIG. 4 represents the statistical distribution DS of the threshold voltages Vt of programmed transistors (curve CA, reading a 0). Under the influence of the electrical stress, the curve CA tends to move slowly to the left, to form a curve CA'. The transistors that come within the curve CA' have lost electric charges and have threshold voltages that are lower than normal. A read voltage VREAD applied to the control gate of these transistors, in the order of 4.5V, is to the left of the curves CA, CA' and does not enable a transistor coming within the curve CA or a transistor coming within the curve CA' to be distinguished.

According to the teaching disclosed by the aforementioned international application, the threshold voltage of programmed transistors is controlled by applying to the control gates of the transistors, as a read voltage, a test voltage VPR found between the two curves CA, CA', such as 6.75 V for example. This voltage allows a correctly programmed transistor to be distinguished from a transistor the floating gate of which has lost electric charges, since in the first case the transistor is off (reading a 0, i.e. the programming logic value) and in the second case the transistor is on (reading a 1, i.e. the erase logic value). The comparison of data read in a group of floating-gate transistors by means of the two voltages VREAD, VPR makes it possible to detect the existence of programmed transistors the threshold voltages of which have become lower than the voltage VPR.

If the comparison shows that the data are not identical, the reference data read with the voltage VREAD are re-recorded in the floating-gate transistors, during a programming cycle that is classical per se and which forms a refresh cycle. At the end of this refresh cycle, the statistical distribution CA' shifts to the right and becomes identical to the statistical distribution CA.

Method for Checking Memory Cells in the Erased State

The observations explained below are therefore a part of the present invention.

Figure 5:
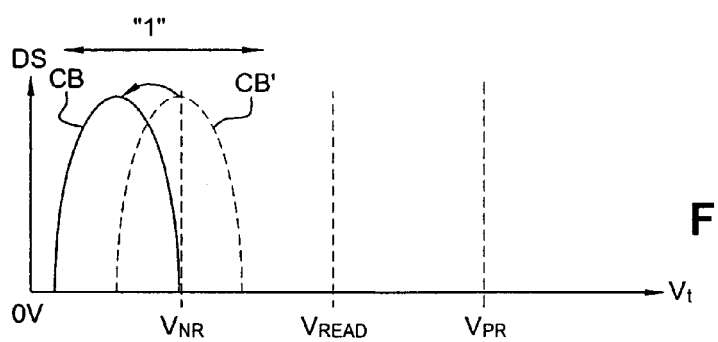
FIG. 5 shows the effect of the programming electrical stress in statistical distribution curves of threshold voltages of floating-gate transistors in the erased state.

FIG. 5 represents the statistical distribution DS of the threshold voltages Vt of erased transistors (curve CB, reading a 1). Under the influence of the electrical stress, the curve CB tends to move slowly to the right, to form a curve CB'. The transistors that come within the curve CB' have undergone a spurious injection of electric charges and have threshold voltages higher than normal. The read voltage VREAD is to the right of the curves CB, CB' and does not allow a transistor coming within the curve CB or a transistor coming within the curve CB' to be distinguished.

Thus, according to the present invention, provision is made for checking the threshold voltage of the erased transistors. This check is performed by applying to the control gates of these transistors, as a read voltage, a test voltage VNR found between the two curves CB, CB', such as 4.25 V for example. This voltage allows a correctly erased transistor to be distinguished from an erased transistor the floating gate of which has undergone a spurious injection of electric charges, since in the first case the transistor is on (reading a 1) and in the second case the transistor is off (reading a 0).

According to the present invention, floating-gate transistors are read by group of M transistors, such as 8 for example, by means of the two voltages VREAD, VNR, and the data read with the two read voltages are then compared. If erased transistors have a threshold voltage higher than the voltage VNR, the data read with the voltage VNR are different from the reference data read with the voltage VREAD. These are then re-recorded in the floating-gate transistors, during a selective erase cycle according to the present invention, described below. This selective erase cycle forms a cycle of refreshing damaged floating-gate transistors. At the end of this refresh cycle, the statistical distribution CB' shifts to the left and becomes identical to the statistical distribution CB.

Method for Selectively Refreshing Memory Cells in the Erased State

Figure 6A:
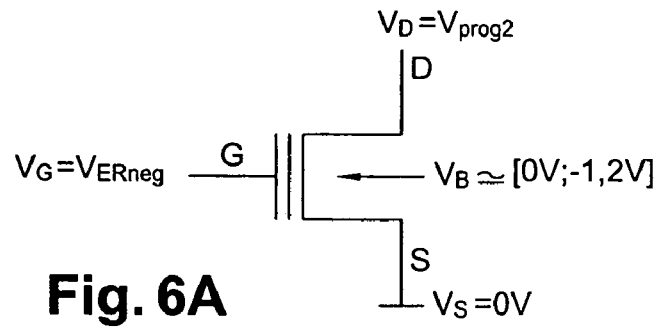
FIGS. 6A, 6B show a method according to the present invention for refreshing floating-gate transistors that are in the erased state.

FIG. 6A shows the voltages applied to the terminals of a floating-gate transistor that must be refreshed in accordance with the method of the present invention. The gate voltage VG of the transistor is classically taken to the negative erase value VERneg.

The idea of the present invention is to apply a positive voltage VD to the drain of the transistor instead of applying the positive voltage VERpos to the channel and to the source of the transistor. An extraction of charges then occurs, by tunnel effect, from the floating gate of the transistor, taken to the voltage VERneg, to the positive voltage source to which the drain is linked.

The advantage of this erase method is that the positive drain voltage VD can be selectively supplied by a programming latch. The positive drain voltage VD is for example the programming voltage Vprog2 which avoids biasing the programming latches with a different voltage from the one used during the programming cycles.

Simultaneously, the source and the channel are taken to electric potentials that do not interfere with the tunnel effect mechanism acting between the control gate and the drain of the transistor, such as the potentials VS=VB=0 V or VS=0 V and VB=−1.2 V for example.

Figure 6B:
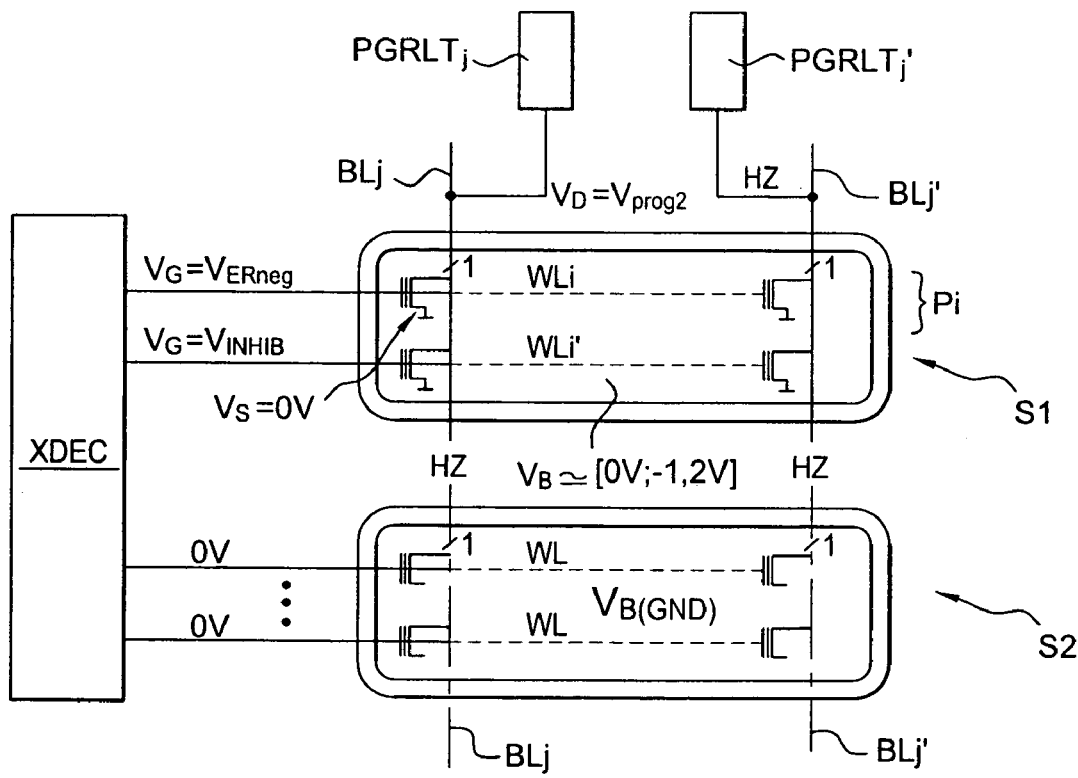

FIG. 6B represents the same Flash memory array as the one represented in FIGS. 2 and 3. It will be assumed that a determined transistor must be erase refreshed, for example the transistor linked to the bit line BLj and the word line WLi of the sector S1.

The word line decoder XDEC applies the erase voltage VG=VERneg to the control gate of the transistor, through the word line WLi. The programming latch PGRLTj applies the drain voltage VD=Vprog2 to the drain of the transistor to be refreshed, through the bit line BLj. The source of the transistor is taken to a zero source voltage VS and the well of the sector S1 is taken to the ground (VB=GND) or to a substantially negative voltage, such as −1.2 V for example. The floating gate of the transistor loses electric charges by tunnel effect, as explained above.

The transistors of the word line WLi that must not be refreshed receive the voltage VERneg at their control gates but do not receive the voltage Vprog2 at their drains, since the corresponding bit lines BLj' are taken to high impedance HZ by the programming latches. If these transistors are in the erased state, they are not refreshed, and if they are in the programmed state, they are not erased.

In summary the refresh according to the present invention is therefore a selective erase process comparable to the programming process, since a positive erase voltage, for example the programming voltage Vprog2 used as an erase voltage, is applied by programming latches that are individually selectable, or by any other equivalent means whereby a positive voltage can be selectively applied to the bit lines.

The word line WLi' that does not correspond to the page in which the transistor to be refreshed is located, receives a zero gate voltage VG. Similarly, in the neighbouring sector S2 all the bit lines are taken to high impedance (HZ) and all the word lines are grounded.

Figure 7:
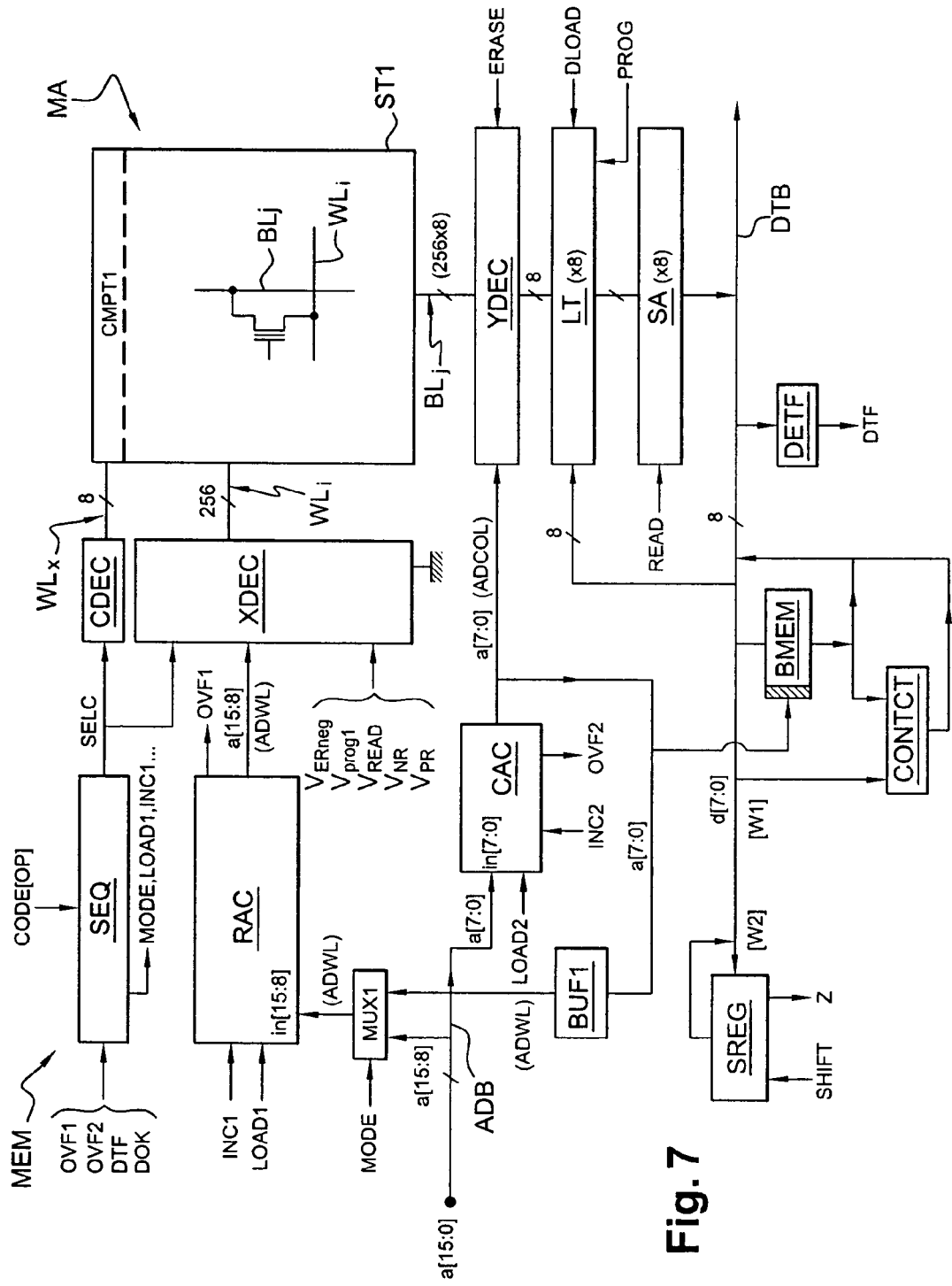
FIG. 7 represents in block form the architecture of a Flash memory implementing the refresh method according to the present invention.
Figure 8:
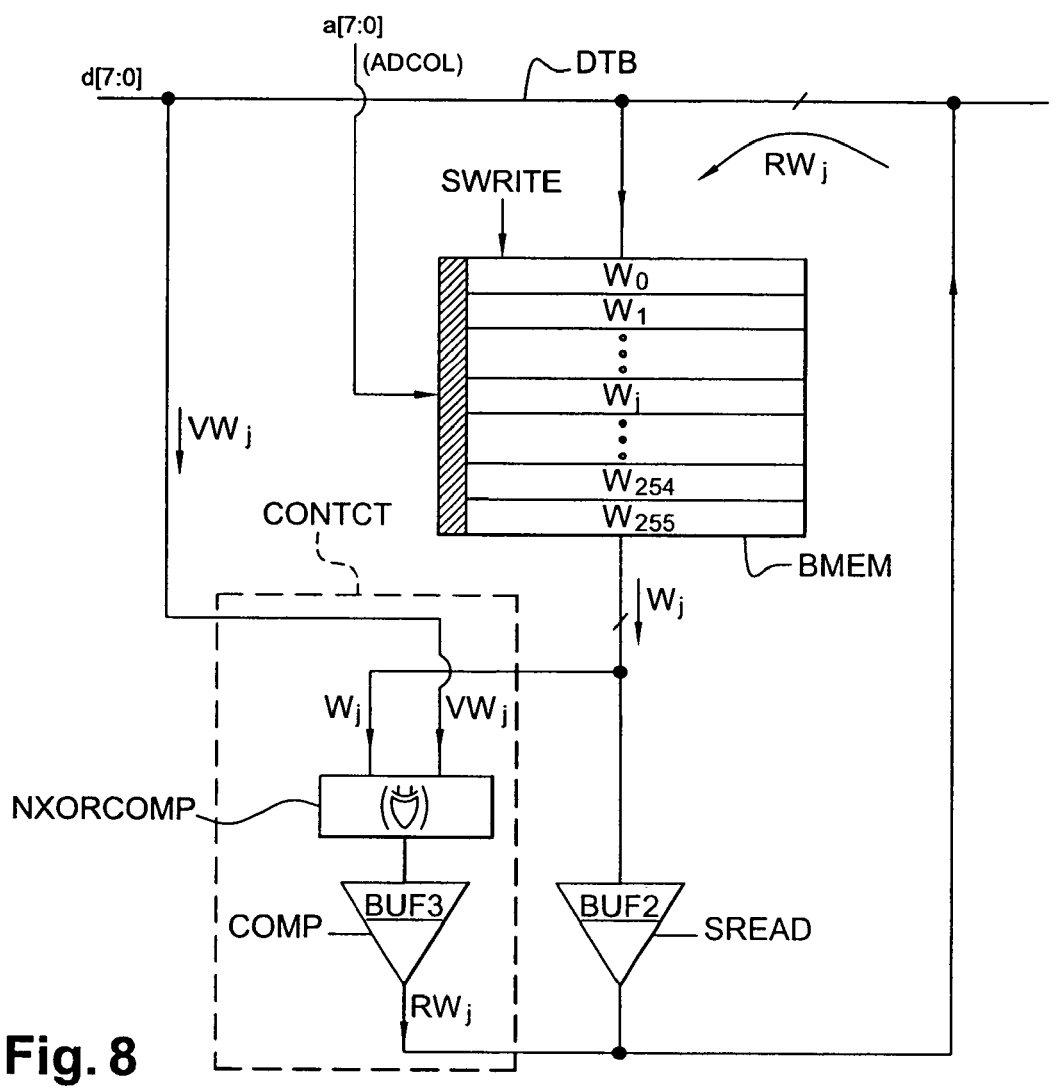
FIG. 8 represents the architecture of a control circuit represented in block form in FIG. 7.

Example of Implementation of the Checking and Refreshing Method According to the Present Invention FIG. 7 represents the general architecture of a memory MEM1 comprising means for implementing the checking and refreshing method according to the present invention. FIG. 8 represents one element of the memory in greater detail.

General Architecture of the Memory

The memory comprises a Flash-type memory array MA comprising at least one sector ST1 of 256 word lines WLi and 2048 bit lines BLj (256×8), each word line comprising 256 words of eight bits, or bytes. The sector ST1 further comprises a special word line WLx the memory cells of which form a counter CMPT1 whereby a page address to be checked and refreshed can be managed.

Although not represented, the memory can comprise various other identical sectors, each comprising a special word line forming a counter.

The memory comprises a word line decoder XDEC for driving the word lines WLi of the sector, and a specific decoder CDEC for driving the word line WLx forming the counter CMPT1 The decoder CDEC is activated by a selecting signal SELC which inhibits the decoder XDEC.

In memory cell read mode, the decoder XDEC can receive one of the three read voltages described above, respectively the read voltage VREAD, the program test voltage VPR and the erase test voltage VNR. In erase mode, the decoder receives the positive erase voltage VERpos and in programming mode the decoder receives the programming voltage Vprog1.

The memory also comprises a column decoder YDEC, a programming register LT comprising programming latches, a read circuit SA comprising sense amplifiers, a row address counter RAC, a column address counter CAC, an address bus ADB carrying an address of sixteen bits a[15:0] and a data bus DTB here carrying eight data bits d[7:0] (M=8).

The column decoder YDEC comprises 256 inputs/outputs of 8 bits linked to the 256×8 bit lines of the memory array MA and eight inputs/outputs linked to the programming register LT and to the read circuit SA.

The register LT comprises eight high-voltage latches (not represented) allowing a byte in the memory array to be programmed. The programming latches have outputs linked to the bit lines of the memory array through the eight inputs/outputs of the column decoder YDEC, and inputs linked to the data bus DTB, for saving data bits d[7:0] upon receiving a signal DLOAD. Upon receiving a programming signal PROG, the output of each latch supplies the programming voltage Vprog2 on a bit line selected by the decoder YDEC, when the bit that has been loaded into the latch is equal to 0 (programming logic value). In the opposite case, the output of the latch remains in the high impedance state.

The read circuit SA here comprises eight sense amplifiers (not represented) linked at input to the eight inputs/outputs of the column decoder YDEC, linked at output to the data bus DTB, and activated by a signal READ.

The counter RAC (Row Address Counter) comprises inputs in[15:8] for receiving eight most significant address bits a[15:8] present on the address bus ADB, forming a word line address ADWL. The output of the counter RAC supplies the address ADWL to the column decoder XDEC. The counter RAC is driven by a signal LOAD1 for loading the address bits, can be incremented by a signal INC1 and supplies a signal OVF1 in the event of address overflow.

The address bits a[15:8] are supplied to the counter RAC through an 8-bit multiplexer MUX1 driven by a signal MODE, having an 8-bit input linked to the address bus ADB and an 8-bit output linked to the inputs in[15:8] of the counter RAC.

The counter CAC (Column Address Counter) comprises inputs in[7:0] linked to the address bus ADB, for receiving 8 least significant address bits a[7:0] forming a column address ADCOL. The output of the counter CAC supplies the column address ADCOL at an address input of the decoder YDEC. The counter CAC is driven by a load signal LOAD2, by an increment signal INC2, and supplies a signal OVF2 equal to 1 when it reaches the last column address.

The memory also comprises an 8-bit shift register SREG with parallel input/output, a logic detector DETF, an 8-bit buffer BUF1, a buffer memory BMEM, a control circuit CONTCT and a sequencer SEQ.

The register SREG comprises a parallel input and a parallel output both linked to the data bus DTB, and is driven by a shift signal SHIFT. It supplies a signal Z equal to 1 when it only contains bits on 0.

The detector DETF is linked at input to the data bus DTB for receiving the data bits d[7:0]. It supplies a signal DTF equal to 1 when the byte present on the data bus is equal to FF (i.e. 11111111). The signal DTF is preferably on 1 when the number of bits on 1 is the majority in a byte analysed, so as to tolerate the existence of defective memory cells in the counter.

The buffer BUF1 has an input receiving the address bits a[7:0] present at the output of the counter CAC, forming the column address ADCOL, and an output linked to a second input of the multiplexer MUX1. The second input of the multiplexer is linked to the output of the multiplexer MUX1 when the signal MODE is on 1.

The buffer memory BMEM and the control circuit CONTCT are represented in greater detail on FIG. 8. The buffer memory comprises an address input receiving the bits a[7:0] of the column address ADCOL supplied by the counter CAC. It comprises a data input linked to the bus DTB and saves a byte d[7:0] present on the bus upon receiving a load signal SWRITE. The buffer memory also comprises a data output linked to the data bus DTB through a buffer BUF2, the on or off state of which is determined by a signal SREAD.

The circuit CONTC comprises an 8-bit comparator NXORCOMP comprising 8 EXCLUSIVE NOR logic gates (NXOR, not represented). Each logic gate comprises a first input linked to the data output of the buffer memory, and a second input linked to the data bus DTB. The outputs of the logic gates are linked to the data bus DTB through a buffer BUF3 the on or off state of which is determined by a signal COMP.

Finally, the hard-wired logic or microprocessor sequencer SEQ supplies all the signals for controlling the elements of the memory MEM1 and receives the signals sent by these elements.

Architecture of the Counter CMPT1

Figure 9:
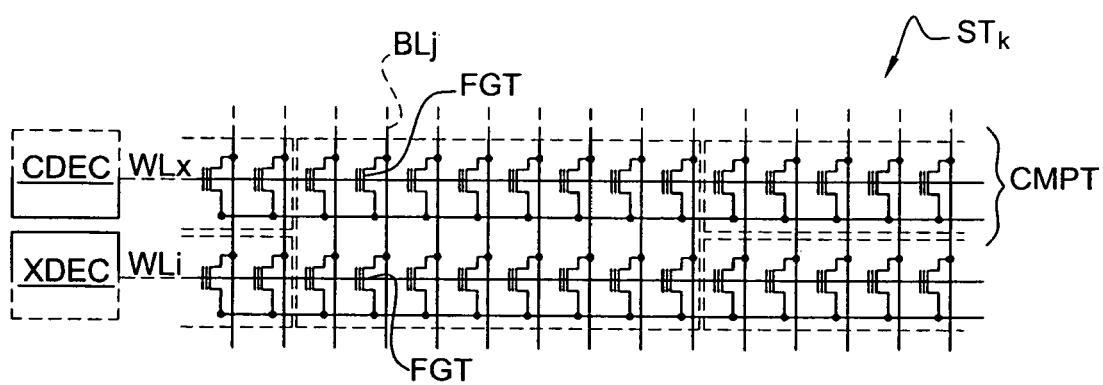
FIG. 9 represents the architecture of a check and refresh counter present in the memory in FIG. 7.

FIG. 9 is a partial view of the sector ST1. The memory cells of the counter CMPT1 are formed by floating-gate transistors FGT that are linked by their control gates to the special word line WLx, and are linked by their drains to the bit lines BLj of the sector. Beneath the word line WLx, a normal word line WLi of the sector can be distinguished, to which the control gates of the floating-gate transistors of a page of the sector are linked (one page corresponding to one word line).

Thus, the counter CMPT1 here comprises 2048 bits, i.e. 256 columns of eight bits each, and is dedicated to managing the addresses of word lines to be checked.

As the sector here comprises 256 word lines and the counter comprises 2048 memory cells, the number of memory cells to form a token of the counter, while using all the memory cells of the counter, is here equal to 2048:256 i.e. 8 memory cells, i.e. 256 tokens available in the counter, each allocated to the designation of a page, the counter being erased after all the pages of the sector have been checked and refreshed.

TABLE 1

| State of the counter | Address of the word line WLi to be checked |
|---|---|
| FFFFFFFFFFFF . . . FFFFFFFFFFF | WL0 |
| 00FFFFFFFFFF . . . FFFFFFFFFFF | WL1 |
| 0000FFFFFFFF . . . FFFFFFFFFFF | WL2 |
| . | . |
| . | . |
| . | . |
| 0000000000000 . . . 000000000FF | WL255 |

The counter CMPT1 is filled in the manner described by table 1. The data are expressed in hexadecimal notation (one character from 0 to F representing 4 bits), the reading of a memory cell in the programmed state corresponds to reading a bit on 0, and the reading of an erased memory cell corresponds to reading a bit on 1. The counter is programmed byte by byte, starting with the least significant bytes, one byte representing one token and the address of the byte in the counter representing the address of a word line to be checked.

General Operation of the Memory

The memory operates classically during operations of reading or writing pages of the memory array. The operations to be performed are communicated to the sequencer in the form of operation codes CODE[OP]. The signal MODE is on 0 and the multiplexer MUX1 links the address bus ADB to the inputs in[15:8] of the counter RAC. When data must be written in a page of the sector ST1, the address of the page is supplied to the counter RAC via the address bus. The data to be saved are first of all loaded into the buffer memory BMEM (signal SWRITE) so as to simulate a page-programming mode (saving a series of words in bursts). Then, the page is erased and the data are read byte by byte in the buffer memory (signal SREAD) and saved byte by byte in the Flash memory array, thanks to the programming latches of the register LT. The column counter CAC is incremented after each operation of programming a byte, until all the memory cells of the page have been programmed (only the memory cells that must receive the programming logic value, here 0, being programmed).

Reading in the Counter the Address of a Page to be Checked

When data have been saved in a page of the sector ST1, the sequencer SEQ triggers a step of reading the counter CMPT1 aiming to determine the address of the page that must be checked.

The sequencer sets the signal MODE to 1, activates the decoder CDEC by means of the signal SELC, sets the counter CAC to zero and activates the read circuit SA (signal READ, read voltage VREAD). The first byte of the counter CMPT1 is supplied on the data bus DTB by the read circuit SA. If the signal DTF at the output of the detection circuit DETF remains on 0, that means that the byte read in the counter CMPT1 is zero. The sequencer then increments the counter CAC by one unit, which corresponds to a jump of one byte since an electric column here comprises eight bit lines. The sequencer reads the next byte of the counter on the data bus, and so on and so forth until the signal DTF changes to 1. When the signal DTF changes to 1, the sequencer knows that the byte read is equal to FF. It is the first non-zero byte of the counter CMPT1.

The column address ADCOL (bits a[7:0]) present at the output of the counter CAC represents the address of the first non-zero byte and corresponds to the position of the first unused token found in the counter. As a token here corresponds to eight data bits, the column address ADCOL forms a word line address ADWL (bits a[15:8]) that designates the page to be refreshed. It is not necessary here to convert this column address into a word line address, since there is an exact correspondence between the column addresses and the word line addresses (each sector comprising 256 word lines each comprising 256 bytes, i.e. 256 electric columns of eight bit lines each).

Thus, the address ADCOL forming a word line address ADWL designating the page to be checked is loaded into the buffer BUF1 to be subsequently supplied to the counter RAC, so as to check the page designated.

Incrementation of the Counter

The counter can be incremented immediately after the reading of the counter and loading of the address ADWL into the buffer BUF1. Before incrementing the counter, the sequencer checks the value of the signal OVF2. If this signal is on 1, that means that the byte read in the counter was the last byte of the counter CMPT1. In this case, the sequencer knows that the counter CMPT1 must be erased before the next page check. This erasing operation can be done simultaneously with the erasing of the next page to be programmed (an operation of programming a page always being preceded by an operation of erasing the page).

In the opposite case, the sequencer increments the counter CMPT1 by one unit. This incrementation involves setting to 0 the first non-zero byte that has been found in the step of searching for the address of the page to be checked. For that purpose, the non-zero byte present in the register SREG is decremented by shifting the register to the right and inserting 0s. As a token is here formed by 8 bits, a byte equal to FF corresponding to an unused token is transformed into a byte equal to 0 corresponding to a used token (i.e. 00 in hexadecimal notation). The incremented value of the byte is then loaded into the register LT via the data bus DTB, and is saved in the counter.

Checking and Refreshing a Page

The address ADWL kept in the buffer BUF1 is applied to the inputs in[15:8] of the counter RAC, through the multiplexer MUX1, and the process of checking the page designated by this address is triggered.

The counter CAC is reset and the bytes of the page are read one by one to be checked and, if necessary, refreshed.

According to the present invention, this check comprises a program check and an erase check to respectively refresh the programmed memory cells having lost electric charges and tending towards the erased state, and refreshing the erased memory cells having lost electric charges and tending towards a programmed state, as described above.

Checking and Refreshing Programmed Memory Cells

After resetting the counter CAC, each byte of the page to be checked is read by means of two different read voltages, the first being the read voltage VREAD and the second being the test voltage VPR higher than VREAD (Cf. FIG. 4). The comparison of the bytes read by means of the two voltages VREAD, VPR makes it possible to detect the floating-gate transistors in the programmed state the threshold voltage of which has become lower than the voltage VPR.

Advantageously, all the bytes of the page are first of all read one after the other with the voltage VREAD, and are stored in the buffer memory. Then, all the bytes of the page are read again one after the other with the test voltage VPR and are compared with the bytes saved in the buffer memory BMEM. As the address input of the buffer memory is here driven by the column address ADCOL, there is an exact correspondence between the column address of a byte read with the test voltage VPR and the address in the buffer memory of the reference byte read with the voltage VREAD.

A byte read with the test voltage VPR is designated VWj and a reference byte saved in the buffer memory is designated Wj. The byte VWj is present on the data bus and is applied to an input of the comparator NXORCOMP. The reference byte Wj read in the buffer memory is applied to the other input of the comparator. The output of the comparator supplies, via the buffer BUF3 (signal COMP), a refresh byte RWj that is saved in the buffer memory at the same address as the initial reference byte Wj.

At the end of the byte-by-byte comparison process, the buffer memory BMEM thus only comprises program refresh bytes RWj. Each bit of a refresh byte is equal to 0 when the bit read with the voltage VPR did not have the same value as the bit read with the voltage VREAD, as described by table 2. Once all the refresh bytes have been loaded into the buffer memory BMEM, the latter is read byte by byte and each byte is saved in the page to be refreshed, through the programming latches.

The programming voltage Vprog1 is supplied to the word line in question by the decoder XDEC and the programming latches supply the programming voltage Vprog2 to the bit lines when they receive a bit on 0, otherwise they remain in the high impedance state (HZ). The 0 is therefore the refresh logic value and the 1 the non-refresh logic value. In other terms, only the floating-gate transistors in which bits of different values have been read during the double read process are re-programmed.

TABLE 2

| Reference bit read with VREAD | bit read with VPR | refresh bit | Output of the programming latch |
|---|---|---|---|
| 0 | 1 | 0 (active value) | Vprog2 |
| 0 | 0 | 1 | HZ |
| 1 | 1 | 1 | HZ |
| 1 | 0 | case impossible | — |

In table 2, case "10" is impossible since the two voltages VREAD, VPR are higher than the limits of the two distribution curves CB, CB' in FIG. 5. Thus, even if a memory cell has a degraded erased state requiring a refresh, that does not affect the reading of the memory cell with each of the two voltages VREAD, VPR. The degraded erased state of this memory cell will be detected during a checking and erase refresh step according to the present invention, which will now be described.

Checking and Refreshing Erased Memory Cells

It has been seen above that the selective erase refresh method according to the present invention is identical to a classical selective program refresh method, as far as the drain voltage applied to the memory cells to be refreshed is concerned, said voltage being in both cases supplied by a programming latch.

In these conditions, the management of the erase refresh of floating-gate transistors is substantially identical to the management of the program refresh.

Thus, after resetting the counter CAC, each byte of the page to be checked is read by means of two different read voltages, the first being the read voltage VREAD and the second being the test voltage VNR lower than VREAD (Cf. FIG. 5). The comparison of the bytes read by means of the two voltages VREAD, VNR makes it possible to detect the floating-gate transistors in the erased state the threshold voltage of which has become higher than the voltage VNR.

As above, all the bytes of the page are read one after the other by means of the voltage VREAD and are stored in the buffer memory. Then, the bytes of the page are read again one after the other by means of the voltage VNR and are compared with the bytes saved in the buffer memory BMEM.

A byte read with the test voltage VNR is again designated VWj and a reference byte saved in the buffer memory is designated Wj. The byte VWj is present on the data bus and is applied to an input of the comparator NXORCOMP. The reference byte Wj read in the buffer memory is applied to the other input of the comparator. The output of the comparator supplies, via the buffer BUF3, a refresh byte RWj that is saved in the buffer memory at the same address as the initial reference byte Wj.

At the end of the byte-by-byte comparison process, the buffer memory BMEM only comprises erase refresh bytes. Each bit of a refresh byte is equal to 0 when the bit read with the voltage VNR did not have the same value as the bit read with the voltage VREAD, as described by table 3 below. Once all the refresh bytes have been loaded into the buffer memory BMEM, the latter is read byte by byte and is saved in the page to be refreshed, through the programming latches. The erase voltage VERneg is supplied to the word line in question by the decoder XDEC and the programming latches supply the programming voltage Vprog2 (here for purposes of erasing) when they receive a bit on 0, otherwise the latches remain in the high impedance state.

Thus, here again, the 0 is the refresh logic value and the 1 the non-refresh logic value. In other terms, only the floating-gate transistors having supplied different bits during the double read process are erase refreshed.

In table 3, case "01" is impossible since the two voltages VREAD, VNR are higher than the limits of the two distribution curves CA, CA' in FIG. 4. Thus, even if a memory cell has a degraded programmed state requiring a refresh, that does not affect the reading of the memory cell with each of the two voltages VREAD, VNR. In any case, the degraded programmed state of this memory cell is presumed to have been corrected during the checking and program refresh step described above, if said step is performed before the erase refresh step.

TABLE 3

| reference bit read with VREAD | bit read with VPR | refresh bit | Output of the programming latch |
|---|---|---|---|
| 1 | 0 | 0 (active value) | Vprog2 |
| 1 | 1 | 1 | HZ |
| 0 | 0 | 1 | HZ |
| 0 | 1 | case impossible | — |

Combination of the Steps of Programming Pages and of Checking Pages

The description above was of an example of implementation of the refresh method according to the present invention, comprising a step of reading the counter, a step of incrementing the counter, a step of checking the programmed memory cells of the page designated by the counter, a step of program refreshing the memory cells requiring this refresh, a step of checking the erased memory cells of the page and a step of refreshing the erased memory cells requiring this refresh.

In practice, this method allows at least one page designated by the counter to be checked after programming at least one user page, i.e. one page designated by the user and not by the counter. Generally speaking, the method allows N pages designated by the counter to be checked (by incrementing N times the counter after each check) after programming M pages of the sector, N and M being whole numbers higher than or equal to 1.

Various combinations of steps are therefore possible:

1) the counter is incremented before a user page is programmed but a page is checked and refreshed after the user page is programmed. In this case, the counter is preferably erased, if necessary, simultaneously with the erasing of the user page to be programmed. As a result, the erasing of the counter is an operation that is transparent to the user and does not lead to any delay in a series of steps of programming pages, 2) the counter is incremented after a page is checked and refreshed, and a page is checked and refreshed after a user page is programmed, 3) the counter is incremented before a page is checked and refreshed, and a page is checked and refreshed before a user page is programmed.

It will be understood by those skilled in the art that various other alternative embodiments of the method according to the present invention may be made, particularly according to the architecture of the memory in which it is implemented.

In particular, the memory can comprise a data bus of N×8 bits with reading of the bytes by group of N in the pages selected, particularly in the page forming the counter. In this case, the column addresses are formed by most significant address bits (for example a[7:1] if N=2) and the least significant address bits (for example a[0] if N=2) are used for selecting one of the N bytes read, at output of the memory with a multiplexer for example. An address converter is then necessary between the output of the counter CAC and the second input of the circuit MUX1, to convert the column address of the group of N bytes read simultaneously into a bit line address. This converter searches for the non-zero byte in the group of N bytes and, if the non-zero byte is the byte of rank n in the group of N bytes, it adds the value n to the column address of the group of bytes to form the address of the page to be refreshed.

Generally speaking, the maximum counting value (CMAX) of a counter according to the present invention can be higher than the number of word lines in a sector. For a better understanding, if the simplified example of a sector of 8 pages (X1=8) is considered in which two pages (K=2) are checked at the same time every four cycles (R=4) of programming pages of the sector, it comes that:

$CMAX = X1R/K = 16$

Thus, this counter can count up to sixteen, i.e. sixteen usable tokens, if one token corresponds to one and only one page, without undergoing a number of electrical stress cycles higher than the number that the other pages of the sector can undergo. If, on the contrary, a token is used to simultaneously designate P pages to be checked, such as two pages for example, by using a function table or an address converter, then the maximum counting value must not be higher than CMAX/P i.e. 8 if P=2.

According to the architecture of the memory used, provision can also be made for a counter management such that, when the maximum counting value is reached and the counter is erased, the maximum number of electrical stress cycles undergone by the memory cells of a counter is lower than the maximum number of stress cycles that the other memory cells of a sector can undergo.

Finally, the term programming latch designates, generally speaking, any means whereby a positive voltage can be selectively applied to a bit line. Thus, in certain memories, the latch function (i.e. the selection of a bit line from a determined address) is integrated into the column decoder and the programming latches are only voltage adapters for converting a supply voltage Vcc into a programming voltage Vprog2 In other memories, the latch function and the voltage conversion function are entirely integrated into the column decoder, such that the existence of the programming latches is only deduced by the existence of the latch function and the supply of the voltage Vprog2 at the output of the decoder.

The method for checking and refreshing memory cells that has just been described is particularly simple to implement and requires few material means. Further more, it is almost transparent to the user since the time for checking and refreshing a page is in the order of 200 µs, as against the time required to previously erase a page, in the order of 5 ms, to which a time in the order of 1,300 µs (256×5 µs) is added for programming the 256 bytes of a page.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. A method for erasing a floating-gate transistor, then checking and refreshing the floating-gate transistor when it is in the erased state, comprising:

erasing, checking, and erase refreshing the floating-gate transistor;

a) wherein erasing includes:
  applying a negative erase voltage to a control gate of the floating-gate transistor; and
  applying a collective positive erase voltage to sources of a group of floating-gate transistors having the floating-gate transistor to be erased; and
b) wherein erase refreshing includes:
  applying a negative erase voltage to the control gate of the floating-gate transistor; and
  selectively applying a positive erase refresh voltage to a drain of the floating-gate transistor.

2. The method according to claim 1 wherein the positive refresh erase voltage is selectively supplied by a programming latch of the floating-gate transistor.

3. The method according to claim 2 wherein the positive refresh erase voltage is equal to a programming voltage supplied by the latch when the floating-gate transistor is programmed.

4. The method according to claim 1, further comprising checking a threshold voltage of the floating-gate transistor, including reading the transistor with a first read voltage and reading the transistor with a second read voltage.

5. The method of claim 1, further comprising taking the drain of the floating-gate transistor to an electric potential that does not interfere with a tunnel effect mechanism acting between the control gate and a source of the floating-gate transistor, and providing the erasing of the floating-gate transistor.

6. The method of claim 5 wherein taking the drain of the floating-gate transistor to the electric potential includes taking the drain to a high impedance potential.

7. The method of claim 1, further comprising taking the source and a channel of the floating-gate transistor to an electric potential that does not interfere with a tunnel effect mechanism acting between the control gate and the drain of the floating-gate transistor, and providing the refreshing of the erased floating-gate transistor.

8. The method of claim 7 wherein taking the source and the channel of the floating-gate transistor to the electric potential includes taking the source and the channel to null or negative potentials.

9. A method for checking and refreshing a page of Flash memory having a plurality of floating-gate transistors linked by their control gates to a common word line, and linked by their drains to different bit lines, the Flash memory having programming latches linked to the bit lines to selectively apply a programming voltage to the drains of the floating-gate transistors, the method comprising:
  erasing a group of floating-gate transistors of the page by;
    applying a negative erase voltage to the word line; and
    applying a collective positive erase voltage to sources of the group of floating-gate transistors to be erased; and
  refreshing the floating-gate transistors of the page that are in the erased state, by:
    applying a negative erase voltage to the word line; and
    selectively applying a positive erase refresh voltage to the bit lines linked to the drains of floating-gate transistors that are to be refreshed.

10. The method according to claim 9 wherein the positive erase voltage is supplied by programming latches.

11. The method according to claim 10 wherein the positive erase voltage is equal to the programming voltage.

12. The method according to claim 9, further comprising checking a threshold voltage of the floating-gate transistors of the page, including reading the transistors with a first read voltage applied to the word line, and reading the transistors with a second read voltage applied to the word line, a transistor only being refreshed if two bits read in the transistor with the two read voltages, have different values.

13. The method according to claim 9, wherein the checking and the refreshing of a page comprises:
  i) reading all the transistors of the page with a first read voltage, by group of M transistors, and loading into a buffer memory groups of M bits read with the first read voltage;
  ii) reading a group of M transistors of the page with a second read voltage;
  iii) logically combining bit by bit the M bits read with the second read voltage and the M bits read with the first read voltage loaded into the buffer memory;
  iv) loading M bits forming the result of the logic combination into the buffer memory;
  v) repeating ii), iii) and iv) for each subsequent group of M transistors, until the page has been entirely checked; and
  vi) successively loading into programming latches the groups of M bits present in the buffer memory, each loading operation being accompanied by an application of the negative erase voltage to the word line and by activation of the programming latches.

14. The method according to claim 13 wherein logically combining bit-by-bit includes using EXCLUSIVE OR logic gates to perform the logic combination.

15. The method according to claim 9, further comprising supplying an address of the page to be checked using a non-volatile counter having memory cells linked to a special word line of the Flash memory.

16. The method according to claim 15 wherein checking the page includes checking an address of the page that varies according to a column address of a first group of M non-programmed memory cells found in the counter.

17. The method according to claim 9, further comprising checking and refreshing floating-gate transistors in a programmed state.

18. A flash memory comprising:
  a memory array having a plurality of floating-gate transistors linked by their control gates to word lines, and by their drains to bit lines, the transistors linked to a same word line forming one page of the memory array;
  programming latches linked to the bit lines to selectively apply a programming voltage to the drains of the floating-gate transistors;
  a counter for designating an address of at least one page to be checked;
  means for checking a threshold voltage of floating-gate transistors in a programmed state of a page designated by the counter, and for reprogramming programmed transistors having a threshold voltage below a first determined threshold;
  means for erasing floating gate transistors by applying a collective positive erase voltage to first terminals of the floating gate transistors; and
  means for checking a threshold voltage of floating-gate transistors in an erased state of the page designated by the counter, and for refreshing erased transistors having a threshold voltage above a second determined threshold by selectively applying a positive erase refresh voltage to second terminals of the floating gate transistors.

19. The flash memory according to claim 18 wherein the means for refreshing erased transistors are arranged for:
  applying a negative erase voltage to the word line to which the erased transistors are linked; and selectively applying the positive erase refresh voltage to the bit lines linked to the drains of floating-gate transistors that are to be refreshed.

20. The memory according to claim 19 wherein the positive erase voltage is supplied by programming latches.

21. The memory according to claim 20 wherein the positive erase voltage is equal to the programming voltage.

22. The memory according to claim 18 wherein the means for checking the threshold voltage of floating-gate transistors in the erased state comprise:
means for reading the transistors with a first read voltage;
means for reading the transistors with a second read voltage; and
means for comparing data read in the transistors with the two read voltages.

23. The memory according to claim 18 wherein the means for checking the threshold voltage of floating-gate transistors in the erased state comprise a buffer memory and a logic combiner and are arranged for:
i) reading all the transistors of the page with a first read voltage by group of M transistors, and loading into the buffer memory groups of M bits read with the first read voltage;
ii) reading a group of M transistors of the page with a second read voltage;
iii) logically combining bit by bit the M bits read with the second read voltage and the M corresponding bits read with the first read voltage and loaded into the buffer memory;
iv) loading into the buffer memory the M bits forming a result of the logic combinations;
v) repeating ii), iii) and iv) for each subsequent group of M transistors, until the page has been fully checked; and
vi) successively loading into programming latches groups of M bits present in the buffer memory, each loading operation being accompanied by an application of the negative erase voltage to the word line and by an activation of the programming latches.

24. The memory according to claim 23 wherein the logic combiner comprises EXCLUSIVE OR logic gates.

25. The memory according to claim 18 wherein the counter is a non-volatile counter comprising memory cells linked to a special word line of the Flash memory.

26. A memory device having a plurality of floating gate transistors, the memory device comprising:
circuit blocks to erase, check, and erase refresh at least one of the floating-gate transistors;
a) wherein the erase circuit block includes:
first circuitry to apply a negative erase voltage to a control gate of the floating-gate transistor; and
second circuitry to apply a collective positive erase voltage to sources of a group of floating-gate transistors having the floating-gate transistor to be erased; and
b) wherein the erase refresh circuit block includes:
third circuitry to apply a negative erase voltage to the control gate of the floating-gate transistor; and
fourth circuitry to selectively apply a positive erase refresh voltage to a drain of the floating-gate transistor.

27. The memory device of claim 26 wherein the floating gate transistors comprise part of flash memory.

28. The memory device of claim 26, further comprising:
fifth circuitry to take the drain of the floating-gate transistor to an electric potential that does not interfere with a tunnel effect mechanism acting between the control gate and a source of the floating-gate transistor; and
sixth circuitry to take the source and a channel of the floating-gate transistor to an electric potential that does not interfere with a tunnel effect mechanism acting between the control gate and the drain of the floating-gate transistor.

* * * * *

UNITED STATES PATENT AND TRADEMARK OFFICE
CERTIFICATE OF CORRECTION

PATENT NO. : 7,050,335 B2
APPLICATION NO. : 10/867378
DATED : May 23, 2006
INVENTOR(S) : Bruno Leconte et al.

It is certified that error appears in the above-identified patent and that said Letters Patent is hereby corrected as shown below:

Column 17
Line 12, "…positive refresh erase voltage…" should read as, --…positive erase refresh voltage…--.
Line 15, "…positive refresh erase voltage…" should read as, --…positive erase refresh voltage…--.
Line 49, "…the page by;" should read as, --…the page by:--
Line 55, "…the erased state, by:" should read as, --the erased state by:--
Line 60, "…positive erase voltage…" should read as, --…positive erase refresh voltage…--.
Line 62, "…positive erase voltage…" should read as, --…positive erase refresh voltage…--.

Column 18
Line 26, "…bit-by-bit…" should read as, --…bit by bit…--.
Line 54, "…floating gate transistors…" should read as, --…floating-gate transistors…--.
Line 56, "…floating gate transistors;…" should read as, --…floating-gate transistors;…--.
Line 62, "…floating gate transistors." should read as, --…floating-gate transistors.--.

Column 19
Line 5, "…positive erase voltage…" should read as, --…positive erase refresh voltage…--.
Line 7, "…positive erase voltage…" should read as, --…positive erase refresh voltage…--.
Line 31, "…the logic combinations;" should read as, --…the logic combination;--.

UNITED STATES PATENT AND TRADEMARK OFFICE
CERTIFICATE OF CORRECTION

PATENT NO. : 7,050,335 B2
APPLICATION NO. : 10/867378
DATED : May 23, 2006
INVENTOR(S) : Bruno Leconte et al.

It is certified that error appears in the above-identified patent and that said Letters Patent is hereby corrected as shown below:

Column 20
Line 8, "...floating gate transistors,..." should read as, --floating-gate transistors,...--.
Line 15, "...positive erase voltage..." should read as, --...positive erase refresh voltage...--.
Line 24, "...floating gate transistors..." should read as, --...floating-gate transistors...--.

Signed and Sealed this

Eighth Day of January, 2008

JON W. DUDAS
*Director of the United States Patent and Trademark Office*

UNITED STATES PATENT AND TRADEMARK OFFICE
CERTIFICATE OF CORRECTION

PATENT NO. : 7,050,335 B2
APPLICATION NO. : 10/867378
DATED : May 23, 2006
INVENTOR(S) : Bruno Leconte et al.

It is certified that error appears in the above-identified patent and that said Letters Patent is hereby corrected as shown below:

Column 17
Line 12 claim 2, "...positive refresh erase voltage..." should read as, --...positive erase refresh voltage...--.
Line 15 claim 3, "...positive refresh erase voltage..." should read as, --...positive erase refresh voltage...--.
Line 49 claim 9, "...the page by;" should read as, --...the page by:"
Line 55 claim 9, "...the erased state, by:" should read as, --the erased state by:"
Line 60 claim 10, "...positive erase voltage..." should read as, --...positive erase refresh voltage...--.
Line 62 claim 11, "...positive erase voltage..." should read as, --...positive erase refresh voltage...--.

Column 18
Line 26 claim 14, "...bit-by-bit..." should read as, --...bit by bit...--.
Line 54 claim 18, "...floating gate transistors..." should read as, --...floating-gate transistors...--.
Line 56 claim 18, "...floating gate transistors;..." should read as, --...floating-gate transistors;...--.
Line 62 claim 18, "...floating gate transistors." should read as, --...floating-gate transistors.--.

Column 19
Line 5 claim 20, "...positive erase voltage..." should read as, --...positive erase refresh voltage...--.
Line 7 claim 21, "...positive erase voltage..." should read as, --...positive erase refresh voltage...--.
Line 31 claim 23, "...the logic combinations;" should read as, --...the logic combination;--.

Column 20
Line 8 claim 26, "...floating gate transistors,..." should read as, --...floating-gate transistors,...--.
Line 15 claim 26, "...positive erase voltage..." should read as, --...positive erase refresh voltage...--.

UNITED STATES PATENT AND TRADEMARK OFFICE
CERTIFICATE OF CORRECTION

PATENT NO. : 7,050,335 B2
APPLICATION NO. : 10/867378
DATED : May 23, 2006
INVENTOR(S) : Bruno Leconte et al.

It is certified that error appears in the above-identified patent and that said Letters Patent is hereby corrected as shown below:

Line 24 claim 27, "…floating gate transistors…" should read as, --…floating-gate transistors…--.

Signed and Sealed this

Nineteenth Day of February, 2008

JON W. DUDAS
*Director of the United States Patent and Trademark Office*